United States Patent [19]
Kawamura et al.

[11] Patent Number: 5,750,316
[45] Date of Patent: May 12, 1998

[54] MANUFACTURE OF SEMICONDUCTOR DEVICE USING A-C ANTI-REFLECTION COATING

[75] Inventors: Eiichi Kawamura; Teruyoshi Yao; Nobuhisa Naori; Koichi Hashimoto; Masaharu Kobayashi; Tadasi Oshima, all of Kawasaki, Japan

[73] Assignee: Fujitsu Limited, Kawasaki, Japan

[21] Appl. No.: 404,550

[22] Filed: Mar. 15, 1995

[30] Foreign Application Priority Data

Mar. 18, 1994 [JP] Japan .................. 6-049548

[51] Int. Cl.$^6$ ...................................... G03C 5/00
[52] U.S. Cl. ...................... 430/311; 430/290; 430/510
[58] Field of Search ............................ 430/311, 510, 430/290

[56] References Cited

U.S. PATENT DOCUMENTS 5,437,961  8/1995  Yano et al. .................. 430/316
5,472,829  12/1995  Ogawa .......................... 430/325

FOREIGN PATENT DOCUMENTS 4138999    6/1992   Germany.
60-235426  11/1985  Japan.
6342744    12/1994  Japan.

*Primary Examiner*—Janet C. Baxter
*Assistant Examiner*—Rosemary Ashton
*Attorney, Agent, or Firm*—Nikaido, Marmelstein, Murray & Oram LLP

[57] ABSTRACT

A method of manufacturing a semiconductor device including the steps of: forming a transparent oxide film on a light reflecting surface; forming an anti-reflective a-c film on the surface of the transparent film; and coating a photoresist film on the surface of the anti-reflective film and patterning the photoresist film, wherein the thicknesses of the anti-reflective film and the transparent film are selected so as to set a standing wave intensity $I_{sw}=I\delta/I_{ave}$ to 0.2 or smaller, where $I_{ave}$ is an average value of light intensity in the photoresist film, and $I\delta$ is an amplitude of a light intensity change. A fine pattern can be formed on a highly reflective substrate with a small size variation and at a high precision.

6 Claims, 9 Drawing Sheets

MANUFACTURE OF SEMICONDUCTOR DEVICE USING A-C ANTI-REFLECTION COATING

BACKGROUND OF THE INVENTION a) Field of the Invention

The present invention relates to a method of manufacturing a semiconductor device including a step of forming a fine pattern on a highly reflective substrate by using an anti-reflection film which prevents light beams for exposing a photoresist film from being reflected at the substrate surface.

b) Description of the Related Art

If light beams for exposing a photoresist are strongly reflected at the surface of a substrate, the region of the photoresist not intended to be exposed may sometimes be exposed. If such reflection cannot be suppressed, the resist pattern after the development may be partially thinned. In order to form a fine pattern at a high precision, it is necessary to suppress reflected light at the substrate surface.

Lithography technique of forming an anti-reflection film under a photoresist film has been investigated. Substance which absorbs light having the wavelength in the range of exposing light is generally selected as the material of an anti-reflective film.

An amorphous carbon (a-C) film can be used as an anti-reflective film of exposing light, from the standpoint of its optical property. An a-C film is a film having carbons without long range ordering as its main composition, including those having the structure almost like a carbon crystal structure and those like organic substances. An a-C:H film is an amorphous carbon film whose dangling bonds are terminated with hydrogen atoms. Amorphous carbon unless otherwise specified also includes the substance made of only carbons without any hydrogen atom. Generally, a-C film is simply called a carbon film in some cases.

Japanese Patent Laid-open Publication No.60-235426 discloses a method of depositing a carbon film on the surface of an Al film to a thickness of 100 nm as an anti-reflection film to be used when a photoresist film on the Al film is exposed. It teaches that a deposited carbon film can subdue a warped or constricted pattern.

An a-C film is absorptive relative to ultraviolet light. A complex index of refraction of an a-C film has a real part and an imaginary part. An a-C film formed on an Al film provides ordinary anti-reflection effect by interference and also operates to attenuate light amount incident to the Al film surface by absorption.

However, it is not certain what kind of a carbon film ensures the anti-reflection effects during a photolithography process. The technology of etching a carbon film used as an anti-reflection film becomes important. However, the etching technology ensuring a process precision sufficient for semiconductor manufacturing processes has not been established as yet.

If a desired resist pattern cannot be formed after a resist film coated on a carbon film is exposed and developed, another resist film is re-made. If both the anti-reflection carbon film and the resist film thereon are to be removed, the processes become complicated. The technique of removing only the resist film without damaging the anti-reflection effect of the underlying carbon film has not yet been established.

The anti-reflection effect of a carbon film deposited on a substrate are not sufficient if a fine pattern, particularly, a pattern of 1 μm or less, is to be formed on a highly reflective substrate. The main reason for this is considered to lie in the reflection of exposing light transmitted through the anti-reflective film, at the surface of the highly reflective substrate. Another reason is considered to lie in the influence of exposing light reflected at the surface of the anti-reflective film because the reflection at the anti-reflective film surface cannot be eliminated.

Therefore, upon patterning a resist film formed on a substrate having a step portion, the line width of the pattern may sometimes change in conformity with the shape of an underlying film because of halation or the like.

The binding energy of carbon is very high so that conventional techniques provide a slow etching rate of the carbon film and a low etching selection ratio between a resist film and the carbon film. It is therefore necessary to thicken a resist film when a carbon film is used as an anti-reflective film, which lowers an exposure precision at the worst.

It is also difficult to remove a carbon film completely. For example, if a carbon film cannot be removed completely and is left between a W wiring layer and an interlevel insulating film, adhesion strengths between the wiring layer and carbon film and between the carbon film and interlevel insulating film are poor. If there is a left carbon film, good electrical connection at a contact hole is not ensured.

SUMMARY OF THE INVENTION

An object of the present invention is to provide an exposure technique allowing formation of a fine pattern on a highly reflective substrate with less variation of pattern sizes and at high precision.

Another object of the present invention is to provide a technique of etching a carbon film at a high etching selection ratio relative to a resist film and a technique of removing a carbon film.

Further object of the present invention is to provide a technique of completely removing a resist film without substantially influencing an underlying carbon film. According to one aspect of the present invention, there is provided a method of manufacturing a semiconductor device including the steps of: forming a transparent film on a light reflecting surface, the transparent film having an absolute value 0.2 or smaller of an imaginary part of a complex refractive index; forming an anti-reflective film on a surface of the transparent film, the anti-reflective film having an absolute value 0.3 or larger of an imaginary part of a complex refractive index; and coating a photoresist film on a surface of the anti-reflection film and patterning the photoresist film by applying light to a necessary area of the photoresist film, wherein the thicknesses of the anti-reflective film and the transparent film are so selected as to set a standing wave intensity $I_{sw} = I\delta I_{ave}$ to 0.2 or smaller, where $I_{ave}$ is an average value of light intensity in the photoresist film, the standing wave being generated by a superposition of light incident to the photoresist film and light reflected from the anti-reflection film, the transparent film, and the light reflecting surface, and $I\delta$ is an amplitude of a light intensity change.

According to another aspect of the present invention, there is provided a method of manufacturing a semiconductor device including the steps of: preparing a substrate having an exposed amorphous carbon film on at least part of a surface of the substrate; and removing the amorphous carbon film by dry etching at a substrate temperature of 70° to 450° C. by using at least one of gases selected from the group consisting of reducing fluoride gas, halogen gas, and gas containing oxygen.

A transparent film and an anti-reflection film laminated in this order on a light reflective surface are selected to have proper film thicknesses. With the proper film thicknesses, it is possible to reduce the total amount of light reflected from the light reflective surface, transparent film surface, and anti-reflection film surface. It becomes therefore possible to reduce the component of a standing wave generated by a superposition of light incident to a resist film formed on the surface of the anti-reflection film and light reflected from all the light reflective surfaces.

With the reduced component of a standing wave, halation can be eliminated and a fine pattern can be formed at a high precision.

An amorphous carbon film can be efficiently etched at a substrate temperature of 70° to 450° C. by using reducing fluoride gas, halogen gas, or gas containing oxygen.

As described above, use of a laminate structure of an anti-reflection film and a transparent film respectively having a proper film thickness allows a resist pattern to be formed on a highly reflective surface at a high precision. Even if an amorphous carbon film is used as an anti-reflection film, it can be selectively and completely removed at a high precision. Accordingly, a lead wire via a contact hole can be connected with good yield.

DETAILED DESCRIPTION OF THE PREFERRED EMBODIMENTS

The basics of the embodiments of the invention will be described with reference to FIG. 1.

Figure 1:
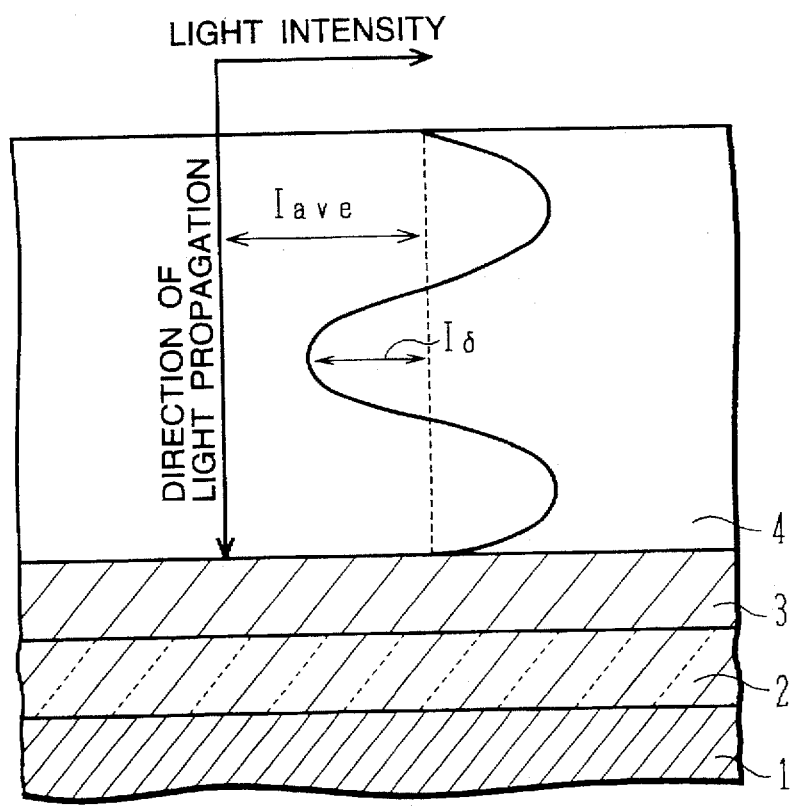
FIG. 1 is a cross sectional view of a substrate explaining the intensity of light in a resist film.

FIG. 1 shows the intensity of exposing light in a resist film under the exposure. On a highly reflective substrate 1, a transparent film 2, an anti-reflection film 3, and a resist film 4 are formed in this order. The anti-reflective film is an a-C:H film. Incident light to the surface of the resist film 4 transmits through the a-C:H film 3 and transparent film 2, and reflects at the surface of the highly reflective substrate 1. Light reflects partially also at the surfaces of the a-C:H film 3 and transparent film 2. There is also multiple reflection in each film. Incoming incident light and outgoing reflected light are superposed in the resist film 4. The amplitudes of incident light and reflected light are generally different so that there is no point in the resist film 4 where the light intensity becomes null. As shown in FIG. 1, maximum and minimum light intensities occur periodically at the interval of a half wavelength in the thickness direction of the resist film 4.

A periodical change in the light intensity as a function of position (depth) indicates a presence of a standing wave in the resist film 4.

The intensity $I_{sw}$ of a standing wave normalized by an average light intensity $I_{ave}$ is given by:

$$I_{sw} = I\delta / I_{ave}$$

where $I\delta$ is an amplitude of a light intensity change. For example, if the amplitudes of incident light and reflected light are equal, a perfect standing wave is generated in the resist film 4. In this case, $I\delta = I_{ave}$ and the standing wave intensity $I_{sw}$ is 1. If there is only incident light and no reflected light, then $I\delta = 0$ and the standing wave intensity $I_{sw}$ is 0. That is to say, as reflection at the underlying film becomes small, the standing wave intensity $I_{sw}$ becomes small.

A small standing wave intensity $I_{sw}$ means a small reflected light intensity. With a small standing wave intensity, the amount of halation becomes less and a finer pattern can be exposed at a high precision.

Figure 2:
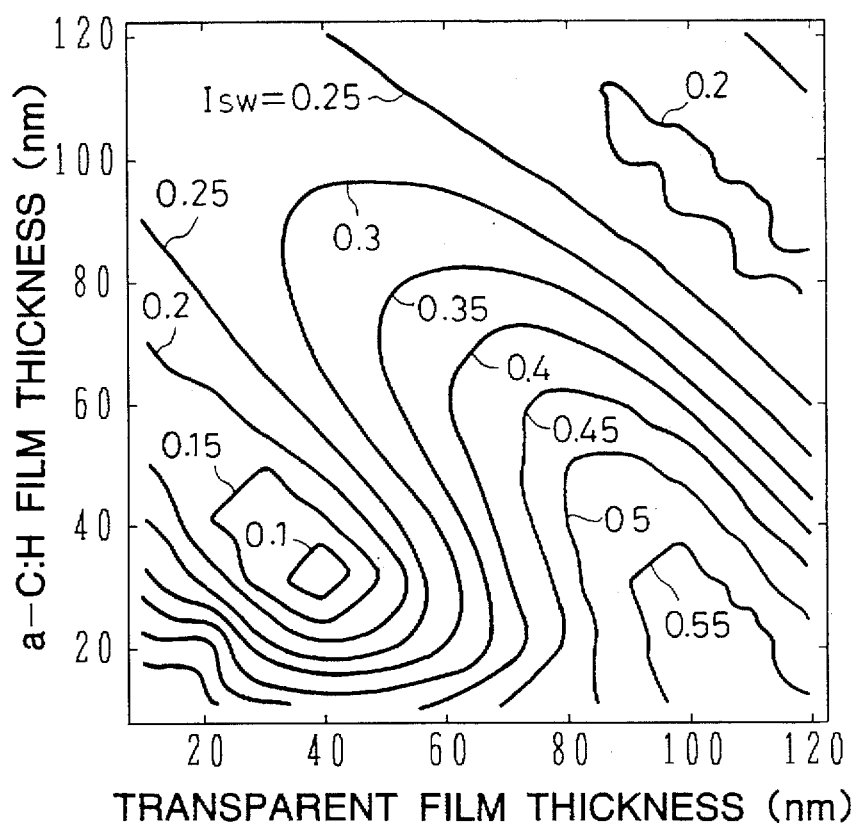
FIG. 2 is a graph showing the intensities of standing waves in a resist film.

FIG. 2 shows the standing wave intensities $I_{sw}$ obtained through simulation, by using the film thicknesses of a transparent film and an anti-reflection film as parameters. The abscissa represents a thickness of a transparent film in the unit of nm, and the ordinate represent a thickness of an a-C:H film in the unit of nm. Numerical values given to respective curves represent the standing wave intensities $I_{sw}$. The simulation was conducted under the conditions that exposing light has a wavelength of 365 nm, the highly reflective substrate 1 (underlying WSi layer) has a complex index of refraction of 2.94–2.66i, the transparent film 2 (high temperature oxidation film (HTO) film) has an refractive index of 1.48, the a-C:H film 3 has a complex refractive index of 1.58–0.752i, and the resist film 4 has a complex index of refraction of 1.65–0.02i, where i represents an imaginary unit.

As seen from FIG. 2, the intensity of a standing wave becomes minimum at the thickness of about 40 nm of the transparent film and at the thickness of about 30 nm of the a-C:H film. A change in the standing wave intensity was simulated near these values of film thicknesses.

Figure 3:
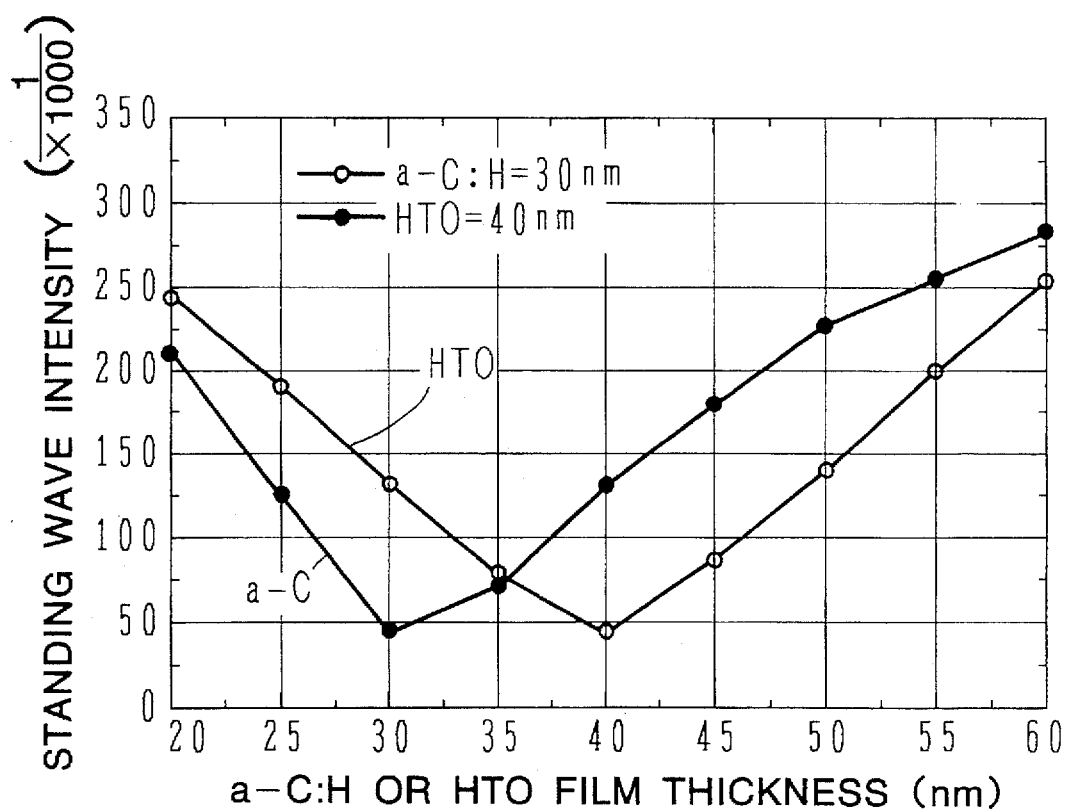
FIG. 3 is another graph showing the intensities of standing waves in the resist film.

FIG. 3 shows the standing wave intensities obtained through simulation, while changing the thickness of the transparent film, with the thickness of the a-C:H film being fixed to 30 nm, and while changing the thickness of the a-C:H film, with the thickness of the transparent film being fixed to 40 nm. The abscissa represents the thickness of the a-C:H film or transparent film in the unit of nm, and the ordinate represents the standing wave intensity $I_{sw}$. An open circle symbol in FIG. 3 shows a standing wave intensity corresponding to a thickness of the transparent film at the fixed thickness of 30 nm of the a-C:H film, and a solid circle symbol shows a standing wave intensity corresponding to a thickness of the a-C:H film at the fixed thickness of 40 nm of the transparent film. It is seen from FIG. 3 that the standing wave intensity $I_{sw}$ takes a minimum value of 0.05 at the thickness of 30 nm of the a-C:H film and at the thickness of 40 nm of the transparent film.

If a pattern with its line width of 0.3 µm is to be formed, it is preferable to suppress a variation of sizes to 10% of the line width, i.e., 0.03 µm or narrower. To this end, it is desired to set the standing wave intensity to 0.2 or smaller. To suppress the standing wave intensity to 0.2 or smaller, the thickness of the transparent film is 25 to 55 nm at the thickness of 30 nm of the a-C:H film and the thickness of the a-C:H film is 21 to 47 nm at the thickness of 40 nm of the transparent film. It is also generally preferable to set the thicknesses of the a-C:H film and transparent film to a value within ±20% of 30 nm and 40 nm respectively, i.e., a value within ±20% of the film thicknesses giving the minimum standing wave intensities respectively.

In the above simulation, the imaginary part (extinction coefficient) of the complex refractive index of the transparent film was 0. A film having an extinction coefficient of 0.2 or smaller can be considered to be substantially a transparent film. Furthermore, although the a-C:H film with an extinction coefficient of 0.752 was used as the anti-reflective film, a film having an extinction coefficient of 0.3 or larger may be used as the anti-reflective film.

Next, the embodiments reducing the above studies to practice will be described. Resist films on samples were patterned. Each sample has as its highly reflective substrate a substrate formed on its surface with a WSi layer having a complex refractive index of 2.94–2.66i, as its transparent film an $SiO_2$ film having a complex (more specifically real) refractive index of 1.48 and a thickness of 40 nm, as its anti-reflective film an a-C:H film having a complex refractive index of 1.58–0.75i and a thickness of 30 nm, and as its resist film a novolak resist film having a complex index of refraction of 1.65–0.02i and a thickness of 0.76 μm. For comparisons sake, samples each having an $SiO_2$ film of 100 nm and other films same as the above samples were also patterned.

Figure 4A:
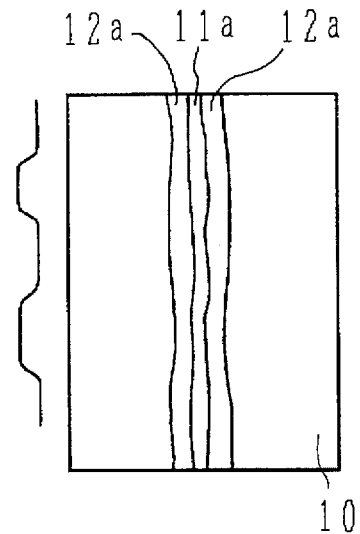
FIGS. 4A and 4B are plan views of the surfaces of resist patterns formed on substrates, the views being sketched from SEM photographs.
Figure 4B:
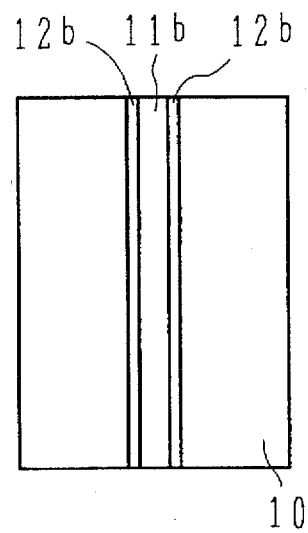

FIGS. 4A and 4B are plan views of the surfaces of resist patterns formed on substrates, the views being sketched from SEM photographs. FIG. 4A shows the surface of a resist pattern on a sample having the a-C:H film of 30 nm thickness and the transparent film of 100 nm thickness, and FIG. 4B shows the surface of a resist pattern on an idealized sample having the a-C:H film of 30 nm and the transparent film of 40 nm thickness. Steps on the substrate surface is schematically shown at the left side of FIG. 4A. Concavities and convexes of the steps extend in the lateral or horizontal direction of the substrates. As shown in FIGS. 4A and 4B, straight resist patterns having slanted surfaces 12a and 12b and top surfaces 11a and 11b are formed on the transparent film 10 in the longitudinal or vertical direction of the substrates. The stripe patterns extend traversing the steps.

The pattern shown in FIG. 4A has a line width which becomes narrow and wide at the steps on the substrate surface, as seen from the shape of the upper surface 11a. The pattern shown in FIG. 4B formed on the sample with ideal thicknesses of the a-C:H film and transparent film has generally a constant line width irrespective of the steps on the substrate surface. It can be therefore understood that a patterning precision can be improved by reducing the amount of reflected light.

The simulation results shown in FIGS. 2 and 3 were obtained by using the mercury i-line of exposing light having a wavelength of 365 nm. As a wavelength changes, an optimum film thickness changes. For example, if a wavelength of exposing light is 248 nm (KrF excimer laser), simulation like the above-described simulation shows that a standing wave intensity can be made small at the amorphous carbon film of 20 to 500 nm thickness and an $SiO_2$ film of 5 to 30 nm or 70 to 110 nm.

As described above, generally a constant line width of a fine pattern can be obtained regardless of steps on an underlying substrate, if the film thicknesses of an a-C:H film and a transparent film are optimized.

In the above embodiment, an a-C:H film and an $SiO_2$ film of high temperature oxidation are used as the anti-reflective film and transparent film, respectively. Other films may also be used. For example, as the anti-reflective film, a carbon film not containing H or slightly containing H may be used. As the transparent film, an inorganic glass film having as its main composition $SiO_2$, such as PSG, BSG, and BPSG having a refractive index of 1.48 to 2.0, or an SiN film having a refractive index of about 2, may be used. The thicknesses of these films are optimized in accordance with the complex indices of refraction of the film materials.

Next, technologies of etching a carbon film or an a-C:H film will be described. Although the etching rate, etc. may change depending on the deposition conditions for forming a carbon film, not much difference will appear whether the film is amorphous or polycrystalline.

Figure 5:
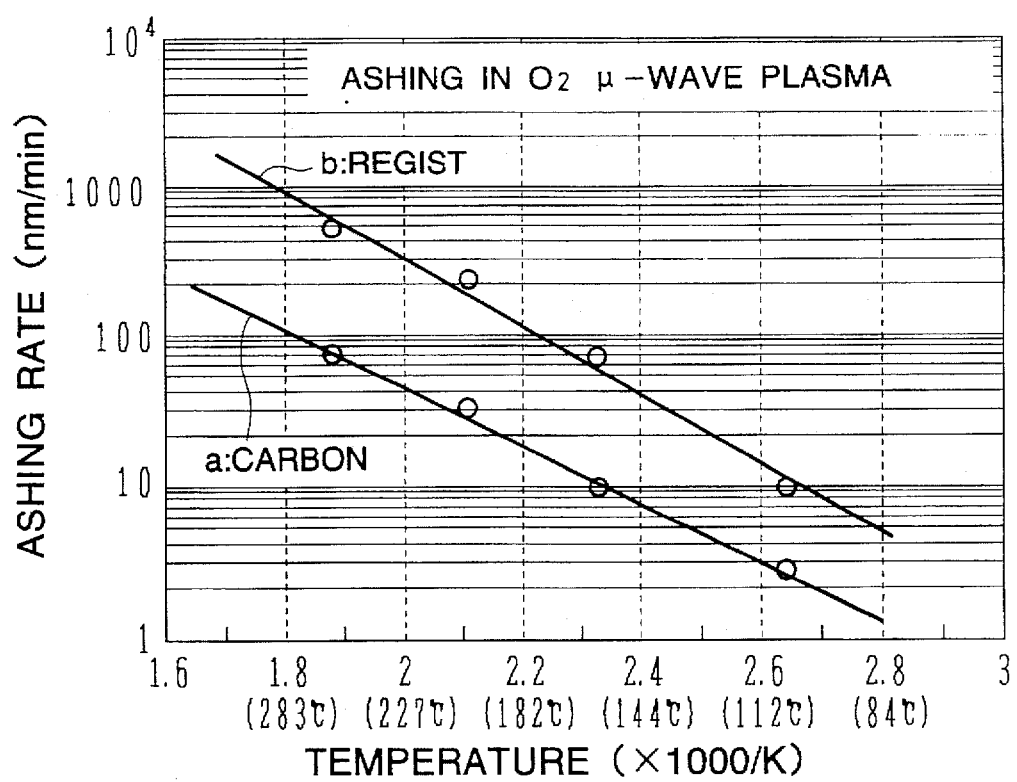
FIG. 5 is a graph showing ashing rates of a-C:H films.

FIG. 5 is a graph showing the relationship between a substrate temperature and an ashing rate when an amorphous carbon film formed by sputtering and a resist film are removed by down-flow of microwave plasma. The abscissa represents an inverse of a substrate temperature in the unit of 1000/K, and the ordinate represents an ashing rate in the unit of nm/min. A solid line a in FIG. 5 indicates an ashing rate of a sputter carbon film, and a solid line b indicates an ashing rate of a resist film.

The resist film was an i-line resist (available from Japan Zeon under a trade name of: ZIR-9100), and ashing was performed under the conditions that $O_2$ ashing gas is flown at 1000 sccm, under the pressure of 1.0 Torr, and at a microwave power of 1.0 kW.

It is seen from this graph that a substrate temperature of about 70° C. or higher is required in order to remove the amorphous carbon film at a significant rate. It is also seen that the substrate temperature is preferably about 150° C. or higher, or more preferably about 200° C. or higher, because semiconductor processes generally require an ashing speed of 10 nm/min or higher, or if higher throughput is desired, about 50 nm/min or higher. The higher the substrate temperature, the larger the ashing selection ratio of the resist film to the amorphous carbon film. If the carbon film as an anti-reflective film is not to be ashed but is to be left, the substrate temperature is required to be set to 450° C. or lower because carbon cannot maintain a solid film at a temperature higher than 450° C.

If an amorphous carbon film is disposed on an underlying Al film, it is preferable to perform ashing, for example, under the conditions that $O_2$ and $CF_4$, gases are flown at 1000 sccm and at 60 sccm, respectively, under a pressure of 1.0 Torr and at a microwave power of 1.0 kW. In this case, it is preferable that the resist film is first removed at a low temperature of about 30° C., and then the substrate is heated to remove the amorphous carbon film. The reason for this is that if the substrate is heated at the initial stage, side wall fences are left. The amorphous carbon film cannot be removed at the temperature of about 30° C.

The amorphous carbon film is removed by down-flow of microwave plasma using $O_2$ gas in FIG. 5. Also in removing an amorphous carbon film by RIE, electron cyclotron resonance (ECR) etching, or the like, the etching speed can be increased by heating the substrate.

For example, RIE may be performed under the conditions that $O_2$ etching gas is flown at 150 sccm under a pressure of 0.2 Torr and at a high frequency power of 150 W, or under the conditions that $CF_4$ and $CHF_3$ etching gasses are flown both at 50 sccm under a pressure of 0.05 Torr and at a high frequency power of 350 W. Under the latter conditions, if the carbon film is disposed on an underlying $SiO_2$ film, the underlying $SiO_2$ film is also etched.

Alternatively, RIE may be performed under the conditions that $SF_6$ and $N_2$ etching gasses are flown both at 50 sccm under a pressure of 0.05 Torr and at a high frequency power of 350 W. Under these conditions, if the carbon film is disposed on an underlying blanket tungsten (B-W) film, the underlying B-W film is also etched. Also under the above-described conditions, the substrate temperature is preferably set to 70° to 450° C.

Instead of the above-described etching gasses, fluorine compound gas such as $NF_3$, halogen gas such as $Cl_2$, Br, and $I_2$, oxygen-containing gas such as CO and $CO_2$, or a mixture gas of these may be used.

A carbon film may be etched by ECR under the conditions that $Cl_2$ and $BCl_3$ etching gasses are flown at 40 sccm and 60 sccm, respectively, under a pressure of 4.0 mTorr and at a microwave power of 800 W and a high frequency power of 150 W. In this case, the substrate temperature is preferable set to 100° to 450° C. Under these conditions, if the carbon film has an underlying Al film, the underlying Al film can also be etched.

Next, a method of preventing a local damage on a substrate surface to be caused by ions reflected at a side wall of a resist film during an RIE process, will be described which uses an a-C:H film used as an anti-reflective film also as an etching mask.

First, problems associated with a conventional MOSFET manufacturing method will be explained with reference to FIGS. 6A to 6G.

Figure 6A:
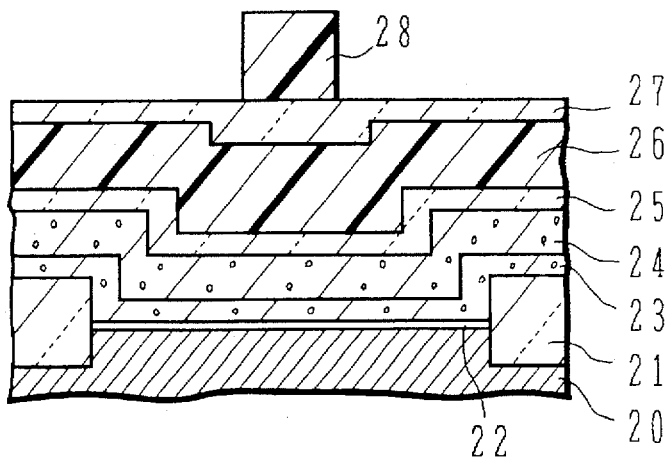
FIGS. 6A to 6G are cross sectional views of a substrate explaining a conventional method of manufacturing a MOSFET.

As shown in FIG. 6A, on the surface of a silicon substrate 20, a field oxide film 21 is formed to define an active region. A gate insulating film 22 is formed on the surface of the active region of the silicon substrate 20. On the gate insulating film 22 and field oxide film 21, a conductive laminate is formed which is constituted, for example, by an amorphous Si or polycrystalline Si film 23 and a silicide film 24. On the conductive film 24, an insulating film 25 such as an $SiO_2$ film is formed.

On the insulating film 25, a photoresist film 26 is coated, and an insulating film 27 such as SOG is coated on the photoresist film 26. The insulating film 27 has a surface planarized more than the surface of the underlying film 26. On the insulating film 27, a resist pattern 28 is formed at a high patterning precision at the region where a gate electrode is formed.

Figure 6B:
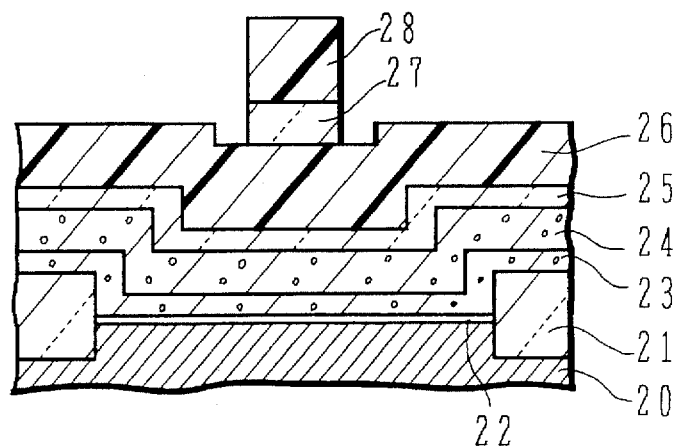

As shown in FIG. 6B, by using the resist pattern 28 as a mask, the insulating film 27 is selectively etched by dry etching. The resist pattern 28 is transferred onto the insulating film pattern 27. After the etching, the resist pattern 28 is removed.

Figure 6C:
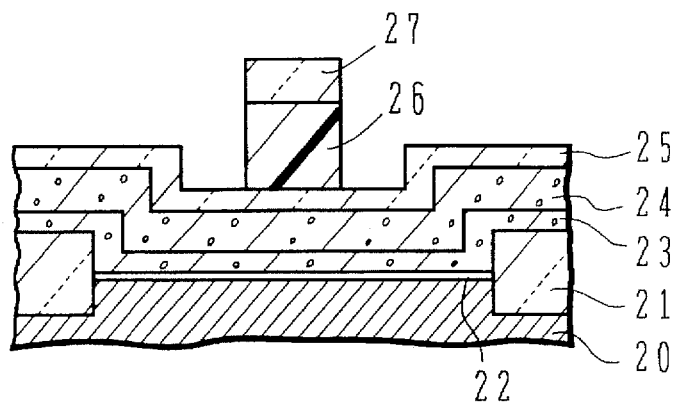

As shown in FIG. 6C, by using the insulating film pattern 27 as a mask, the resist film 26 is selectively etched by dry etching.

Figure 6D:
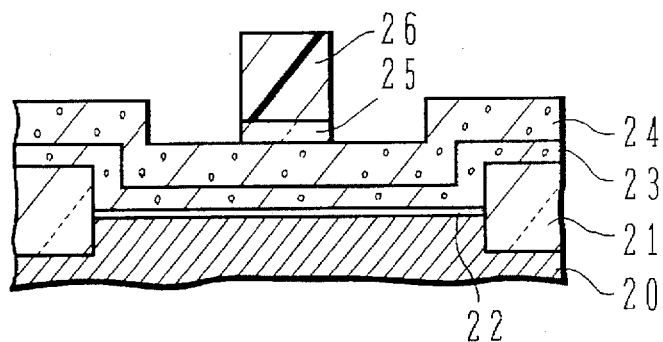

As shown in FIG. 6D, by using the resist film 26 as a mask, the insulating film 25 is selectively etched by dry etching. At this time, the insulating film 27 on the resist film 26 is removed.

Figure 6E:
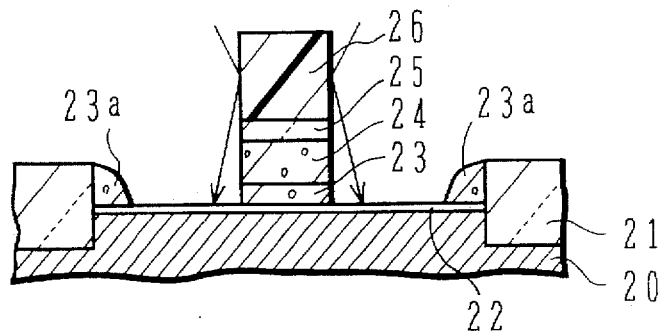

As shown in FIG. 6E, by using the resist film 26 as a mask, the conductive layers 23 and 24 are dry-etched to form a gate electrode. If a variation of sizes of patterned resist films 26 to be formed at the process explained with FIG. 6C is large, the precision of a gate length becomes unstable.

As indicated by arrows in FIG. 6E, upon anisotropically dry etching the conductive films 23 and 24, ions are reflected at the side wall of the resist film 26 and collide with the substrate surface near the gate electrode, so that the substrate surface near the gate electrode is locally etched. If the etching is stopped immediately after the gate insulating film is exposed in order to suppress an excessive etching of the substrate surface near the gate electrode, the conductive film regions 23a are left at the edge portions of the field oxide film 21. These conductive film regions 23a may generate a leak current between semiconductor elements or between source/drain regions.

Figure 6F:
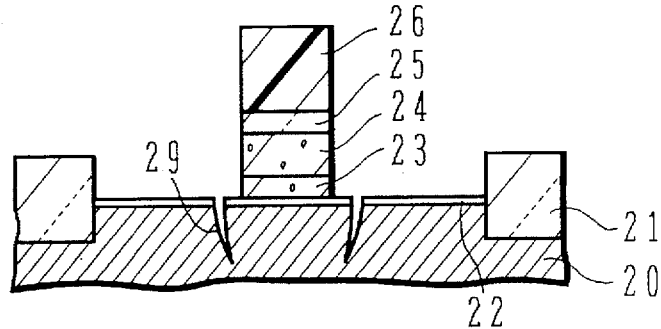

As shown in FIG. 6F, if the etching is performed until the conductive film regions 23a are completely removed, the substrate surface near the gate electrode is excessively etched and grooves 29 may be formed.

Figure 6G:
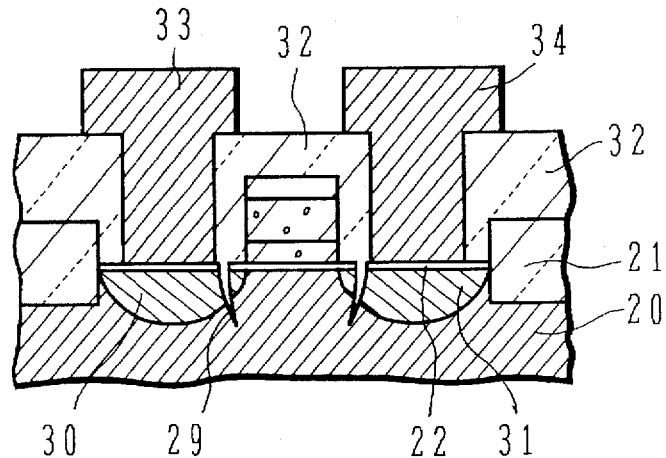

As shown in FIG. 6G, by using the gate electrode structure as a mask, source and drain regions 30 and 32 are formed by ion implantation. The gate electrode structure may be an LDD (lightly doped drain) structure by forming a side wall on the gate structure and implanting ions again. Next, an interlevel insulating film 32 is formed. Contact holes are formed in the interlevel insulating film 32 at the regions corresponding to the source/drain regions 30 and 31. Thereafter, source/drain electrodes 33 and 34 are formed.

Since the grooves 29 are formed in the source/drain regions 30 and 31 near the gate electrode of the MOSFET shown in FIG. 6G, no drain current will flow. A defective device is therefore formed by ions reflected from the side wall of the resist film 26.

Next, the embodiment of the invention will be described with reference to FIGS. 7A to 7F.

Figure 7A:
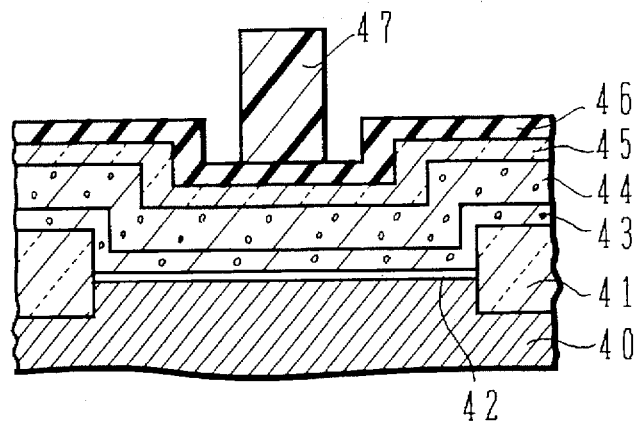
FIGS. 7A to 7F are cross sectional views of a substrate explaining a method of manufacturing a MOSFET according to an embodiment of the invention.

As shown in FIG. 7A, on the surface of a silicon substrate 40, a field oxide film 41 is formed to define an active region. A gate insulating film 42 is formed on the surface of the active region of the silicon substrate 40 by thermal oxidation. On the gate insulating film 42 and field oxide film 41, an amorphous Si conductive film 43 and a WSi conductive film 44 are formed by CVD and laminated together. On the conductive film 44, an insulating film 45 such as an $SiO_2$ film is formed by CVD.

On the insulating film 45, an a-C:H film 46 as an anti-reflective film is formed by CVD or sputtering. On the a-C:H film 46, a resist pattern 47 is formed on the region where a gate electrode is formed.

Figure 7B:
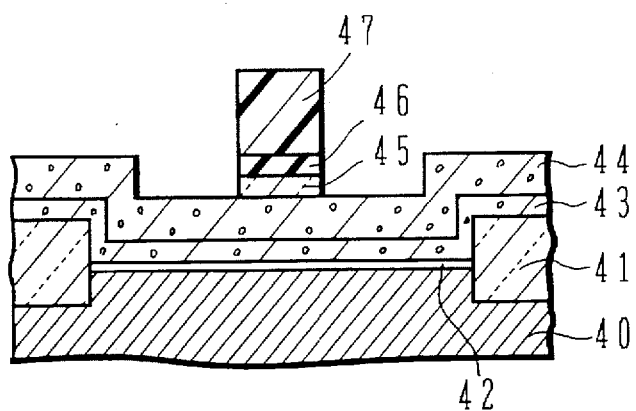

As shown in FIG. 7B, by using the resist pattern 47 as an etching mask, the a-C:H film 46 and insulating film 45 are selectively etched by dry etching. The etching conditions are flow rates of 60, 10, and 400 sccm of $CF_4$, $CHF_3$, and Ar gases, a pressure of 500 mTorr, and an input power of 500 W.

Figure 7C:
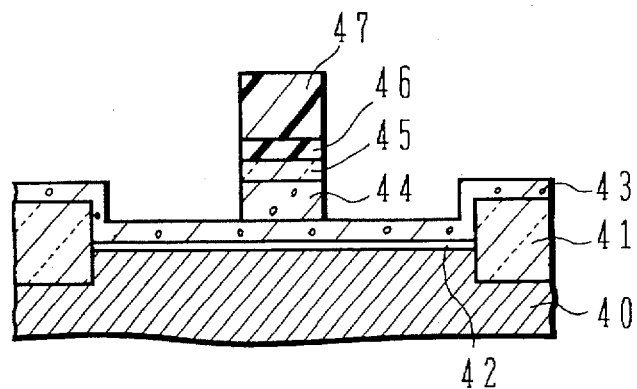

As shown in FIG. 7C, by using the resist pattern 47 as an etching mask, the conductive film 44 is selectively dry-etched by using chlorine-containing gas. The etching is stopped at the surface of the conductive film 43 by controlling the etching time or by other controls.

Figure 7D:
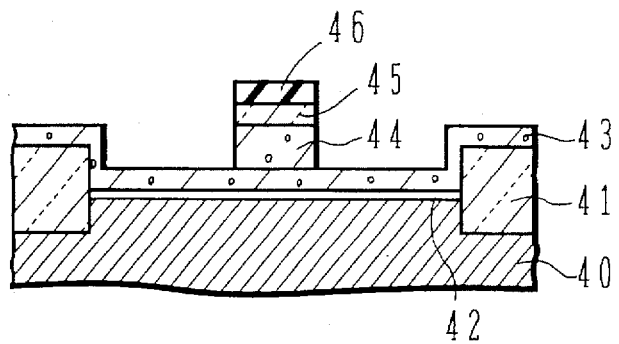

As shown in FIG. 7D, the resist pattern 47 on the a-C:H film 46 is removed. For example, etching is done by µ-wave excited $O_2$+$CF_4$ plasma down-flow at room temperature. For example, the power of µ-wave is 1kW, the flow rates of $O_2$ and $CF_4$ are 1000 and 60 sccm, the pressure is 1 Torr and the temperature is 30° C.

Figure 7E:
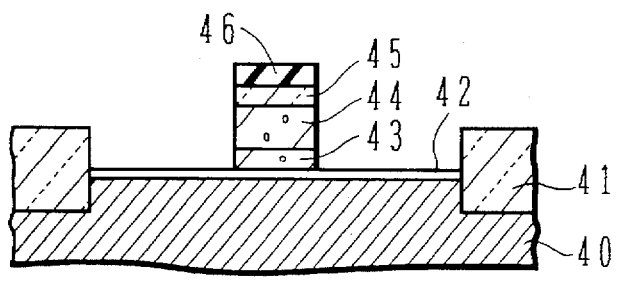

As shown in FIG. 7E, by using the a-C:H film 46 as an etching mask, the conductive film 43 is dry-etched to form a gate electrode. In this case, the etching is performed by lowering the input high frequency power to slow down the etching rate and by raising the etching selection ratio of the conductive layer 43 to the gate insulating film 42. After the etching, the a-C:H film 46 is removed.

Figure 7F:
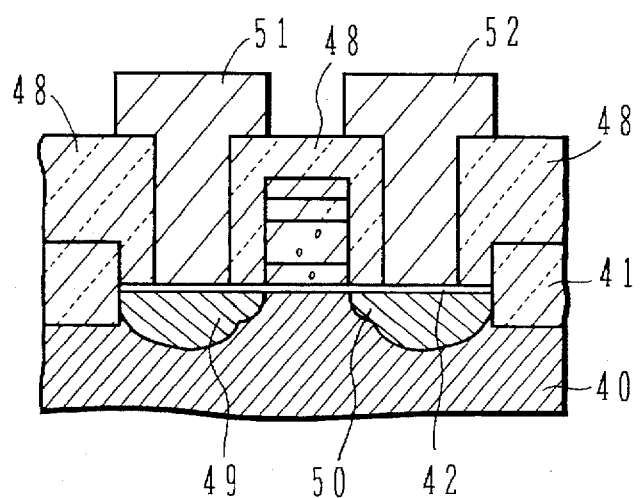

As shown in FIG. 7F, by using the gate electrode structure as a mask, source and drain regions 49 and 50 are formed by ion implantation. The source/drain structure may be an LDD structure by forming a side wall on the gate structure and implanting ions again. FIG. 7F is drawn as having an LDD structure. Next, an interlevel insulating film 48 such as $SiO_2$ is formed by CVD. Contact holes are formed in the inter-level insulating film 48 at the regions corresponding to the source/drain regions 49 and 50. Thereafter, source/drain electrodes 51 and 52 are formed.

In this embodiment, since a resist film is not used as an etching mask at the process illustrated in FIG. 7E, there is no ion to be reflected at the side wall of a resist film. It is therefore possible to prevent the substrate surface near the gate electrode from being excessively etched. Since there is no local damage on the substrate surface near the gate electrode, the conductive film 43 at the end portions of the field oxide film 41 can be completely removed.

Of semiconductor manufacturing processes for making current finely patterned integrated circuits, a photolithography process is required to have a very strict alignment precision. If the alignment precision is lower than a standard level, the resist pattern is removed and a resist film is coated to form a new resist pattern again. If a chemically amplified type negative resist film is used, oxygen plasma ashing is generally used for the removal of the resist film.

However, if a chemically amplified negative resist film is removed by oxygen plasma ashing, at least part of an a-C:H film is also removed. If an a-C:H film has any scratch, the process of depositing an a-C:H film is again performed, greatly lowering manufacturing throughput. It has been desired to develop a method of removing only a chemically amplified type negative resist without removing an a-C:H film.

An embodiment of a method of removing a chemically amplified type negative resist on an a-C:H film will be described next.

A chemically amplified type negative resist was formed on an a-C:H film, and the negative resist film was removed by using a mixed solution of concentrated sulfuric acid and hydrogen peroxide aqueous solution of 1.3 weight %. The negative resist was completely removed in 1 to 3 minutes. Similar results are obtained in other kinds of photoresist.

The etching rate of the a-C:H film by this etchant was about 0.15 nm/min which is substantially negligible. Therefore, although the exposed surface of the a-C:H film is exposed to the etchant for 1 to 3 minutes, the film thickness to be etched during this time period is about 0.15 to 0.45 nm. The thickness of an a-C:H film used as an anti-reflective film is generally about 20 nm. The etched film thickness of 0.45 nm is about 2% of the whole film thickness so that the function of the anti-reflection film is not practically degraded.

Only concentrated sulfuric acid may be used as etchant. If hydrogen peroxide has a composition of 20% or less, the mixed solution can provide the same effects. As etchant, alkaline solution may be used, such as ammonium hydroxide, hydrazine-containing compound, and tetramethyl ammonium hydroxide.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device, said method comprising the steps of:

forming a transparent film on a light reflecting surface, said transparent film having an absolute value 0.2 or smaller of an imaginary part of a complex refractive index;

forming an anti-reflective film on a surface of said transparent film, said anti-reflective film having an absolute value 0.3 or larger of an imaginary part of a complex refractive index; and coating a photoresist film on a surface of said anti-reflective film and patterning said photoresist film by applying incident light to an area of said photoresist film, wherein thicknesses of said anti-reflective film and said transparent film are so selected as to provide a standing wave generated by a superposition of the incident light and reflected light reflected from said anti-reflective film, said transparent film, and said light reflecting surface, wherein an intensity of the standing wave $I_{sw}=I\delta/I_{ave}$ to 0.2 or smaller, where $I_{ave}$ is an average value of light intensity in said photoresist film, and wherein $I\delta$ is an amplitude of a change in light intensity.

2. A method according to claim 1, wherein the thickness of said anti-reflective film is selected to have a value within ±20% of a film thickness which provides a minimum standing wave intensity Isw.

3. A method according to claim 1, wherein the thickness of said transparent film is selected to have a value within ±20% of a film thickness which provides a minimum standing wave intensity $I_{sw}$.

4. A method according to claim 1, wherein the incident light incident to said photoresist film is an i-line having a wavelength of about 365 nm, wherein said anti-reflective film is formed as an amorphous carbon film having a thickness of 21 to 47 nm, said transparent film is an $SiO_2$ film having a thickness of 25 to 55 nm, and wherein the light reflecting surface is a WSi surface.

5. A method according to claim 1, wherein the incident light incident to said photoresist film has a wavelength of 228 to 268 nm, said anti-reflective film is formed as an amorphous carbon film having a thickness of 20 to 50 nm, said transparent film is formed as an $SiO_2$ film having a thickness of 5 to 30 nm or 70 to 110 nm, and wherein the light reflecting surface is a WSi surface.

6. A method according to claim 1, wherein said anti-reflective film is formed as one of an amorphous carbon film and a hydrocarbon compound film containing carbon and hydrogen, and said transparent film is formed as one of a silicon oxide film, a silicon nitride film, and an inorganic glass film.

* * * * *